(12) United States Patent
Lauffer

(10) Patent No.: US 11,713,505 B2
(45) Date of Patent: Aug. 1, 2023

(54) DEVICE AND METHOD FOR CONTROLLING THE CEILING TEMPERATURE OF A CVD REACTOR

(71) Applicant: AIXTRON SE, Herzogenrath (DE)

(72) Inventor: Peter Sebald Lauffer, Aachen (DE)

(73) Assignee: AIXTRON SE, Herzogenrath (DE)

( * ) Notice: Subject to any disclaimer, the term of this patent is extended or adjusted under 35 U.S.C. 154(b) by 291 days.

(21) Appl. No.: 17/250,809

(22) PCT Filed: Sep. 3, 2019

(86) PCT No.: PCT/EP2019/073464
§ 371 (c)(1),
(2) Date: Mar. 4, 2021

(87) PCT Pub. No.: WO2020/048981
PCT Pub. Date: Mar. 12, 2020

(65) Prior Publication Data
US 2021/0310120 A1 Oct. 7, 2021

(30) Foreign Application Priority Data
Sep. 7, 2018 (DE) .................. 10 2018 121 854.0

(51) Int. Cl.
*C23C 16/44* (2006.01)
*C23C 16/52* (2006.01)

(52) U.S. Cl.
CPC .......... *C23C 16/4411* (2013.01); *C23C 16/52* (2013.01)

(58) Field of Classification Search
CPC ..... C23C 16/4411; C23C 16/52; C23C 16/46; C23C 16/466
See application file for complete search history.

(56) References Cited

U.S. PATENT DOCUMENTS

| | | | | |
|---|---|---|---|---|
| 6,095,083 | A | * | 8/2000 | Rice ...................... C23C 16/517 118/724 |
| 6,492,625 | B1 | * | 12/2002 | Boguslavskiy ... H01L 21/68764 219/486 |
| 2015/0090693 | A1 | | 4/2015 | Ito et al. |
| 2015/0218701 | A1 | | 8/2015 | Bartlett et al. |
| 2016/0282886 | A1 | | 9/2016 | Leighton et al. |

(Continued)

FOREIGN PATENT DOCUMENTS

| DE | 100 64 942 A1 | 7/2002 |
|---|---|---|
| DE | 696 20 590 T2 | 11/2002 |

(Continued)

OTHER PUBLICATIONS

Written Opinion dated Mar. 27, 2020, from the ISA/European Patent Office, for International Patent Application No. PCT/EP2019/073464 (filed Sep. 3, 2019), English translation, 14 pgs.

(Continued)

*Primary Examiner* — Jeffrie R Lund
(74) *Attorney, Agent, or Firm* — Ascenda Law Group, PC

(57) ABSTRACT

A CVD reactor may include a susceptor, process chamber and heat dissipation body. In the CVD reactor, one or more layers can be deposited on one or more substrates. The susceptor is heated by a heating devices. Heat is transported from susceptor, through a process chamber towards the process chamber ceiling, through the process chamber ceiling, and from the process chamber ceiling through a gap space to the heat dissipation body. The temperature of the process chamber ceiling is measured at at least two different azimuth angle positions about a central axis of the process chamber. The radial distance of the respective measurement points or zones from the central axis of the process chamber may be equal to one another. The at least two temperature measurement values are used to produce an average value or a difference value.

16 Claims, 4 Drawing Sheets

(56) References Cited

U.S. PATENT DOCUMENTS

| | | | | |
|---|---|---|---|---|
| 2021/0310120 A1* | 10/2021 | Lauffer | ................ | C23C 16/466 |
| 2022/0106687 A1* | 4/2022 | Lauffer | ................... | C23C 16/46 |

FOREIGN PATENT DOCUMENTS

| | | | | | |
|---|---|---|---|---|---|
| DE | 102 47 921 | A1 | | 4/2004 | |
| DE | 10 2007 009 145 | A1 | | 8/2008 | |
| DE | 10 2010 000 554 | A1 | | 9/2010 | |
| DE | 10 2014 106 871 | A1 | | 11/2015 | |
| DE | 10 2017 105 333 | A1 | | 9/2018 | |
| JP | 2008-195995 | A | | 8/2008 | |
| JP | 2013-251442 | A | | 12/2013 | |
| JP | 2013251442 | A | * | 12/2013 | |
| JP | 2017-190506 | A | | 10/2017 | |
| KR | 20160085823 | A | * | 7/2016 | |
| WO | WO-2013127891 | A1 | * | 9/2013 | ............. C23C 16/46 |

OTHER PUBLICATIONS

International Preliminary Report on Patentability dated Mar. 9, 2021, from The International Bureau of WIPO, for International Patent Application No. PCT/EP2019/073464 (filed Sep. 3, 2019), 17 pgs.

International Preliminary Report on Patentability dated Mar. 9, 2021, from The International Bureau of WIPO, for International Patent Application No. PCT/EP2019/073464 (filed Sep. 3, 2019), English translation, 15 pgs.

International Search Report dated Mar. 27, 2020, from the ISA/European Patent Office, for International Patent Application No. PCT/EP2019/073464 (filed Sep. 3, 2019), 12 pgs.

Written Opinion dated Mar. 27, 2020, from the ISA/European Patent Office, for International Patent Application No. PCT/EP2019/073464 (filed Sep. 3, 2019), 16 pgs.

* cited by examiner

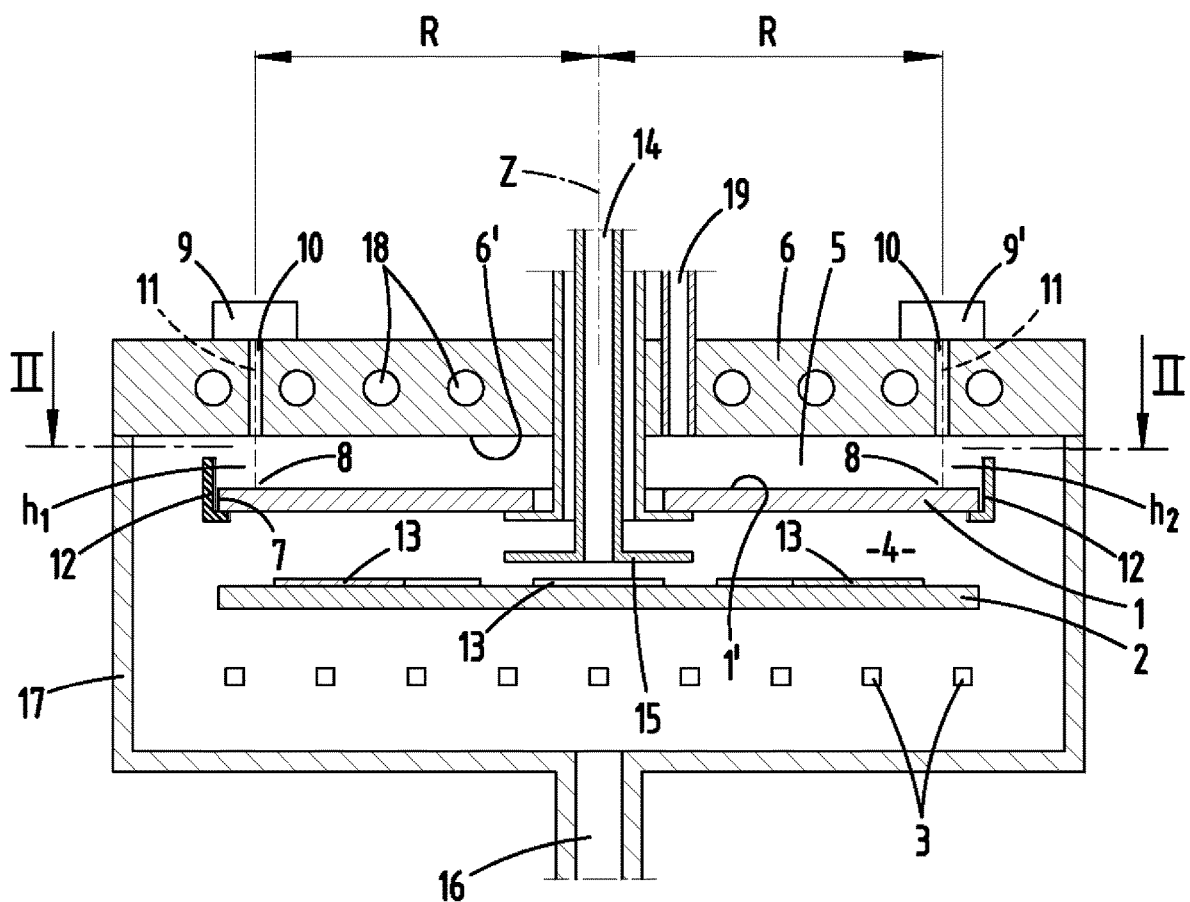

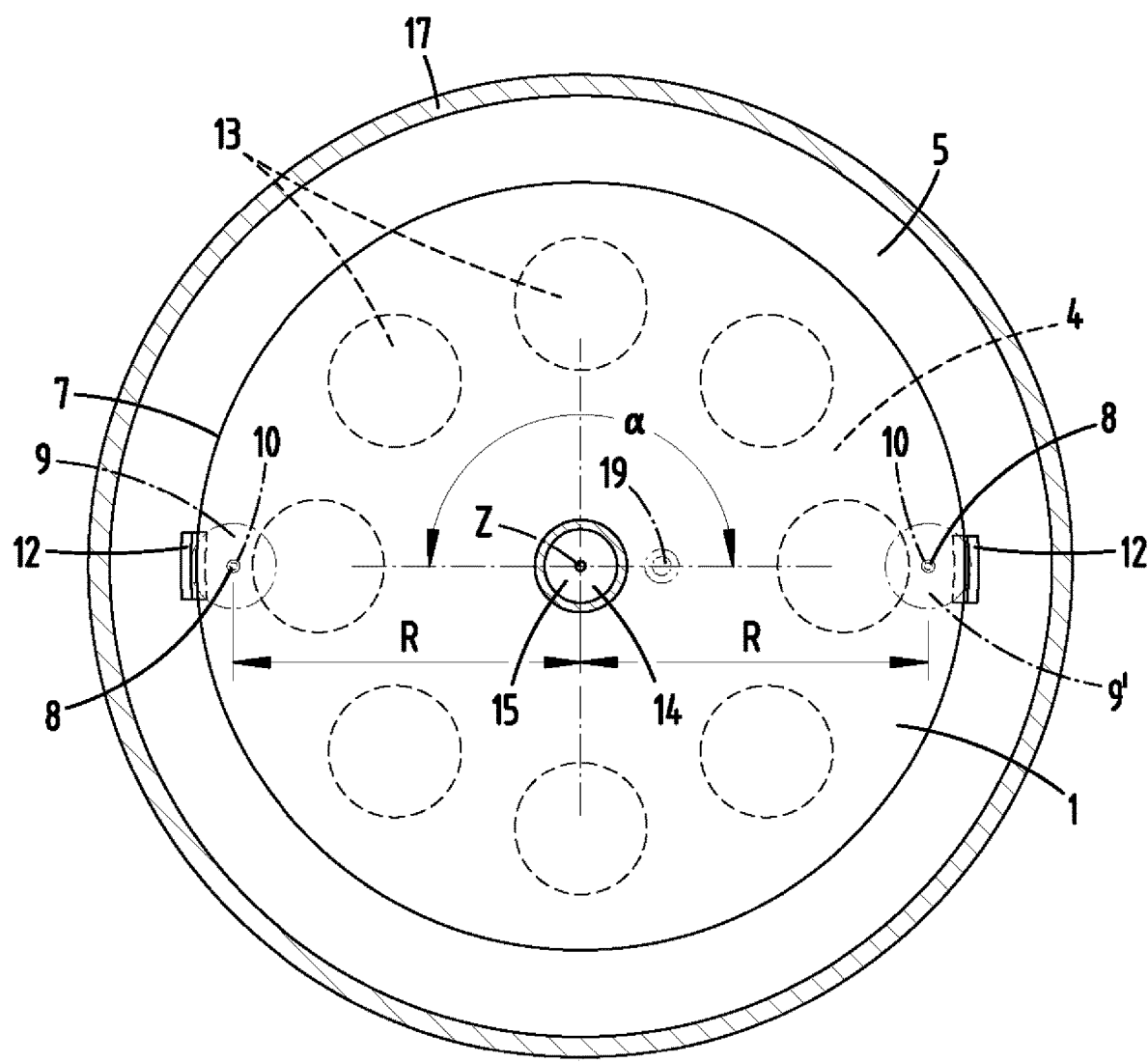

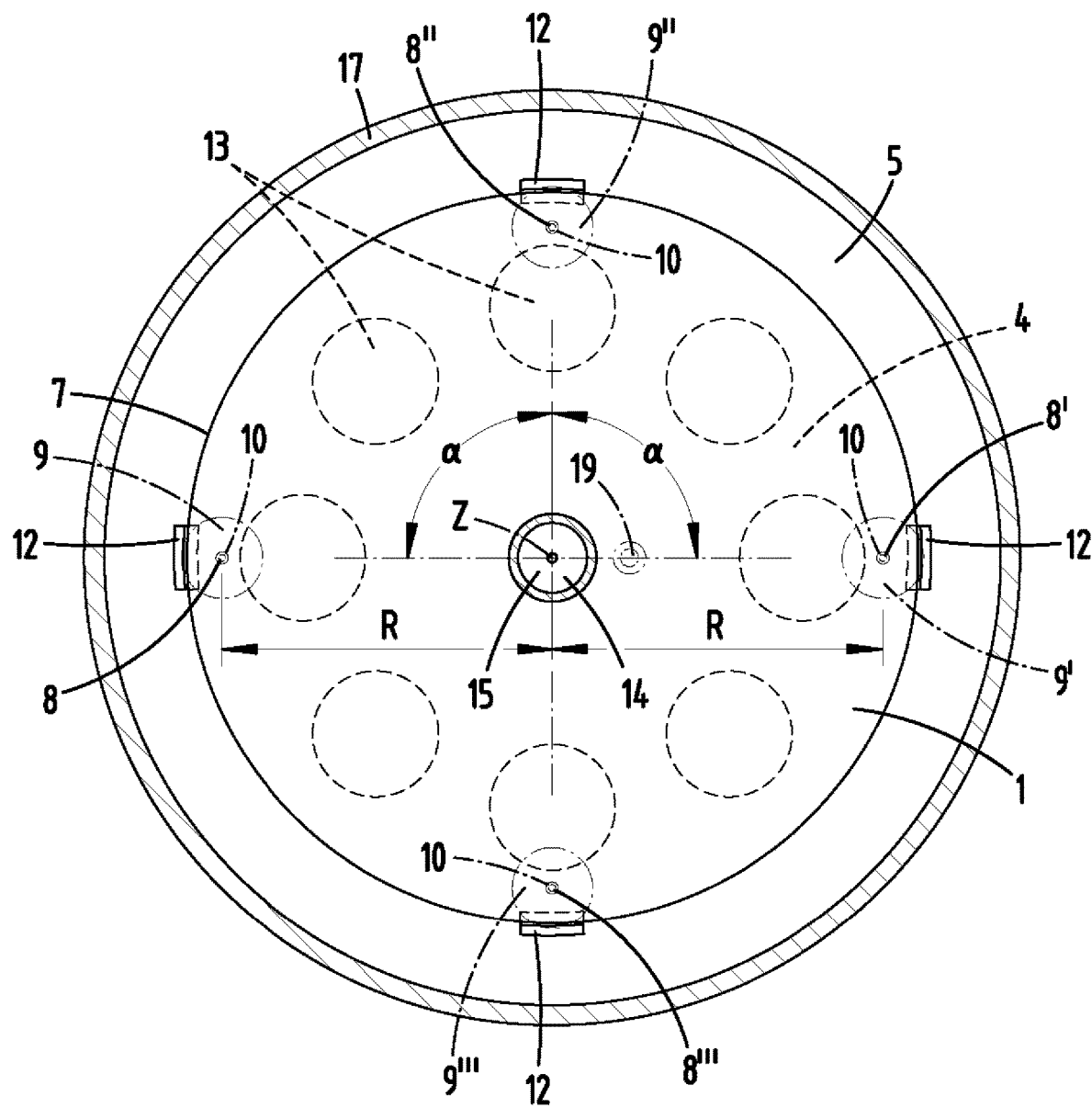

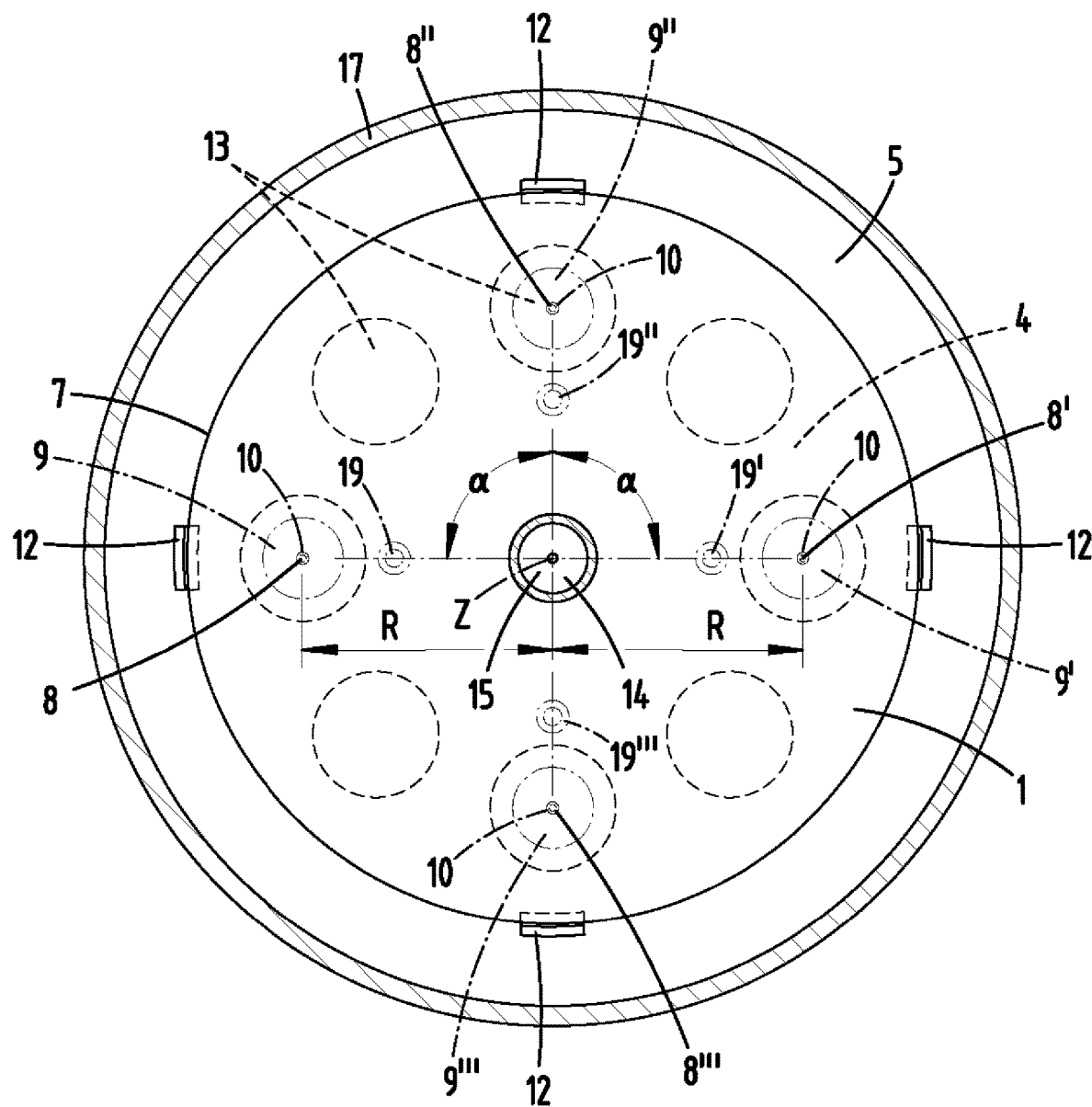

DEVICE AND METHOD FOR CONTROLLING THE CEILING TEMPERATURE OF A CVD REACTOR

RELATED APPLICATIONS

This application is a National Stage under 35 USC 371 of and claims priority to International Application No. PCT/EP2019/073464, filed 3 Sep. 2019, which claims the priority benefit of DE Application No. 10 2018 121 854.0, filed 7 Sep. 2018.

FIELD OF THE INVENTION

The invention relates to a method for setting up or operating a CVD reactor, with which one or a plurality of layers can be deposited on one or a plurality of substrates, wherein a susceptor is heated by means of a heating device, heat is transported from the susceptor, through a process chamber, to a process chamber ceiling, through the process chamber ceiling, and from the process chamber ceiling, through a gap space, to a heat dissipation body.

The invention also relates to a device for carrying out the method.

BACKGROUND

DE 10 2010 000 554 A1 describes an MOCVD reactor with a reactor housing, in which a susceptor is arranged, which can be heated from below with a heating device. Substrates can be placed on a broad surface of the susceptor facing towards a process chamber, and can be coated by the introduction of process gases into the process chamber. The process chamber is bounded at the top by a process chamber ceiling. Above the process chamber ceiling, a heat dissipation body is located, with temperature control channels for the dissipation of the heat that is transferred from the susceptor, through the process chamber, to the process chamber ceiling. For the adjustment of the temperature profile of the process chamber ceiling, heat conducting bodies are used, which have a non-planar surface facing towards the process chamber ceiling. With these measures, the radial temperature profile within a process chamber is adjusted.

CVD reactors with susceptors heated from below, and cooled process chamber ceilings, are also of known art from DE 10 2007 009 145 A1 and DE 10 2014 106 871 A1.

Conventionally, the temperature of the process chamber ceiling is only determined at one point, despite measures to homogenize it. This point is selected arbitrarily, so that an arbitrary temperature is measured at this point, which deviates from an exact average temperature. The average temperature is needed in order to determine the actual energy flux through the reactor from the susceptor to the heat dissipation body. Here the heat flux can be varied by varying the thermal conductivity of a purge gas in the gap space between the process chamber ceiling and the heat dissipation body. The purge gas consists of a mixture of at least two gases, which differ greatly with regard to their thermal conductivity properties, so that, depending on the mixing ratio of the two gases, either a highly thermally conductive purge gas, or an only slightly thermally conductive purge gas, is flowing through, or is present in, the gap space between the process chamber ceiling and the heat dissipation body.

As a result of tolerances or distortions of the components, the gap heights can alter locally, wherein the "gap height" is understood to be the distance between the lower face of the heat dissipation body, facing towards the process chamber ceiling, and the upper face of the process chamber ceiling, facing towards the heat dissipation body. Such a local alteration in the gap height leads to locally differing temperatures on the lower face of the process chamber ceiling.

If the purge gas mixture is now adjusted using the arbitrary temperature signal, the local variation of the gap height translates into a deviation of the average surface temperature of the process chamber ceiling from the setpoint value. If the process chamber ceiling (maintenance) and/or heat dissipation body (system) are replaced, new tolerances or distortions ensue, and thus other local variations of the gap height, and thus other deviations of the average surface temperature from the setpoint value may be present.

Since the chemical reactions taking place in the process chamber are strongly temperature dependent, such temperature differences lead to different reaction rates in the process chamber, so that different growth conditions prevail at different locations in the process chamber, or between two systems, for the deposition of one or a plurality of layers on the substrate. This has the consequence that qualitatively different layers are deposited on different layers, or different systems achieve different growth results, which is not desirable. The prior art further includes DE 102 47 921 A1, DE 10 2017 105 333 A1, DE 696 20 590 T2, US 2015/0 218 701 A1, US 2016/0 282 886 A1, JP 2013-251442 A and JP 2017-190506 A.

SUMMARY OF THE INVENTION

The invention is based on the object of the elimination of the disadvantages of the prior art described above and, in particular, of the specification of means for a more meaningful determination of the process chamber ceiling temperature, and thus for more precise information concerning the energy balance of the CVD reactor.

The objective is achieved by means of the invention specified in the claims, wherein the subsidiary claims represent not only advantageous further developments of the independent claims, but also independent solutions of the objective.

First and foremost, a method for setting up or operating a CVD reactor is proposed, as is a device to be used in the latter. Here, during the setting up procedure, the CVD reactor is operated without substrates, or only with test substrates, and during operation, the CVD reactor is operated with substrates. Here, thermal energy is generated by means of the heating device, which in particular is supplied to the susceptor as heat. A temperature of the process chamber ceiling is measured at at least two different azimuthal angular positions, with respect to a central axis of the process chamber, and at the same radial distance from the central axis of the process chamber. Here the heat can be generated as thermal radiation from an IR-heater. However, the heat can also be transported inductively from the heating device to the susceptor, wherein at least some of the heat is transported from the susceptor, through the process chamber, and the process chamber ceiling, to the heat dissipation body, where it is led away, for example, by means of a coolant. The heat flux through the gap space can be regulated, in particular altered, by means of a suitable purge gas composition. The purge gas consists, for example, of a mixture of hydrogen and nitrogen, or two other gases that differ greatly with regard to their thermal conductivity, so that, by means of the composition of the purge gas mixture in the gap space, the thermal resistance of the gap space can be adjusted. A gas supply line is provided, with which the purge gas mixture is fed into the gap space, which forms a purge gas channel between the heat dissipation body and the process chamber ceiling. The gap height is smaller by at least a factor of 100, preferably by a factor of 200, than a characteristic lateral extensive length of the process chamber ceiling, for example a diameter of the process chamber ceiling. The distance between the process chamber ceiling and the heat dissipation body is in the range of 0.5 to 3 mm. In accordance with the invention, the device has at least two measuring devices, arranged in each case at different azimuthal angular positions about a central axis of the process chamber, and at the same radial distance from the process chamber, so that at least two temperatures are measured at the same radial distance from the central axis, but at two different angular positions. Thus, a first temperature is measured at a first measuring point and a second temperature is measured at a second measuring point, wherein the measuring points have the same radial distance with respect to a central axis of the process chamber, but are arranged with respect to the central axis at a first and a second angular position. For this purpose, the process chamber, and in particular the process chamber ceiling, possesses a circular outline. The temperature measuring devices are preferably arranged at the rear of the process chamber ceiling, with respect to the process chamber, so that the measured temperatures are surface temperatures. In particular, these take the form of surface temperatures of zones of the broad surface of the process chamber ceiling facing towards the heat dissipation body. The zones can be distanced from the edge, adjacent to the edge, or directly at the edge. The said zones are preferably adjacent to the edge, such that their distance to the radially outer edge of the, for example, circular process chamber ceiling is less than their distance to the central axis which runs through center of the process chamber ceiling. However, the zones can also be located in a region that is distanced from the central axis to the same extent as the substrates resting on the susceptor. In a further development of the invention, provision is made for the azimuthal angular positions to be uniformly distributed about the central axis. The angular separation of the adjacent temperature measuring zones and the temperature measuring devices is then always the same. In a preferred configuration of the invention, the at least two temperature measuring devices are pyrometers. The pyrometers can be arranged outside the reactor housing. The reactor housing ceiling, which can also be formed by the heat dissipation body, possesses a channel, through which the optical beam path of the pyrometer passes, with which the surface temperature of the rear face of the process chamber ceiling is measured at the measuring zones. An average value can be formed from the at least two temperatures. A difference value can be formed from the at least two temperatures. Preferably, both an average value and a difference value are formed. The average value can be used to select the composition of the purge gas. The purge gas consists of at least two gases, having different thermal conductivity properties, which can also be noble gases. For example, $H_2/N_2$, or Ar/He, or $H_2$/Ar, come into use as gas pairs. The difference value can be used to make local corrections to the gap height; for example, the process chamber ceiling can be connected to the reactor housing in a height-adjustable manner. If, between two measured temperatures, difference values ensue that exceed a predefined threshold value, the gap height can be adjusted locally. This alters the length of the heat transfer path in the gap space and, consequently, the heat flux through the gap space. However, an exceedance by one or a plurality of difference values of one or a plurality of predefined setpoint values can also be taken as a reason to replace a process chamber ceiling, or to reject a new process chamber ceiling that has replaced a defective process chamber ceiling, that is to say, one in which the spacing varied too much, in the course of maintenance of the CVD reactor. In a variant of the invention in which the broad surfaces of the process chamber ceiling and the heat dissipation body facing each other are planes, just two temperature measuring devices, for example pyrometers, can be used. The said two temperature measuring devices are arranged about the central axis with an angular offset of 180 degrees. In such a configuration, a tilting of the two surfaces facing each other at two diametrically opposite points leads to a minimum and a maximum gap height. In the region of the minimum gap height, the process chamber ceiling temperature is a minimum. In the region of the maximum gap height, the process chamber ceiling temperature is a maximum. On a circular arc line about the central axis of the process chamber, which intersects the center of the process chamber ceiling, the temperature curve has a sinusoidal character. It is therefore irrelevant at which angular position the two diametrically opposed measuring zones are arranged. The average value of the temperatures measured at these two zones is the average value of the process chamber ceiling temperature. In a variant of the invention, provision is made for a plurality of purge gas supply lines to be provided. The purge gas supply lines can be arranged in a uniform angular distribution about the central axis. Thus, circumferentially adjacent segments of the gap space are formed, which can be purged with an individual purge gas mixture of a high heat conductivity purge gas and a low heat conductivity purge gas. The mixing ratio of the two gases of the purge gas is adjusted on the basis of the measured temperatures.

BRIEF DESCRIPTION OF THE DRAWINGS

Examples of embodiments of the invention are explained in what follows with reference to the accompanying drawings. Here:

FIG. 1 shows a schematically illustrated cross-section through a CVD reactor,

FIG. 2 shows in a sectional plane, in accordance with the line II-II in FIG. 1, the plan view onto the process chamber ceiling 1, under which the susceptor 2 is located, of a first example of embodiment, in which just two temperature measuring devices 9, 9' are provided, which measure the process chamber ceiling temperature at two opposing temperature measuring zones 8, 8', FIG. 3 shows an illustration in accordance with FIG. 2 of a second example embodiment, in which four temperature measuring devices 9, 9', 9", 9'" are provided, which measure process chamber ceiling temperatures at four temperature measuring zones 8, 8', 8", 8'", which in each case are offset from one another by an angle α of 90 degrees, and FIG. 4 shows an illustration in accordance with FIG. 2 of a third example embodiment.

DETAILED DESCRIPTION

The CVD reactor illustrated in the drawings is intended for the deposition of layers of elements of the III- and V-main groups on substrates 13, which are arranged on a susceptor 2. On the side of the susceptor 2 facing away from the heating device 3 there is located a process chamber, which is bounded at the top by a process chamber ceiling 1.

Above the process chamber ceiling 1 is located a heat dissipation body 6 with cooling channels 18, through which flows a liquid coolant. Between the broad surface 1' of the process chamber ceiling 1 facing towards the heat dissipation body 6 and the lower face 6' of the heat dissipation body 6 there is located a gap space 5, which can have gap heights $h_1$, $h_2$ at two different points that differ as a result of tolerances, by design, or as a result of distortion.

A gas inlet element 15 opens into the process chamber 4, which element is fed by a gas inlet 14, which is located along the central axis Z of the process chamber 4. The process chamber ceiling 1 is an essentially circular disc-shaped body, made of graphite, quartz, or a suitable metal. The process chamber ceiling 1 has an opening that is located along the central axis Z, through which the gas inlet 14 passes.

A purge gas supply line 19 is provided, through which a purge gas can be fed into the gap space 5 between the process chamber ceiling 1 and the heat dissipation body 6. The purge gas consists of a mixture of at least two gases, which have different heat conduction properties. The two gases can take the form of nitrogen and hydrogen. Depending on whether the gas mixture consists predominantly of nitrogen, or predominantly of hydrogen, the gap space 5 has a different heat transfer resistance, so that by virtue of the high temperature difference between the susceptor 2 and the heat dissipation body 6 of several hundred degrees, an average value of the process chamber ceiling temperature can be set by way of the composition of the purge gas.

A plurality of substrates 13 are arranged on the susceptor 2 in a circular arrangement about the central axis Z.

The gap height, which is usually about 1 mm, is shown greatly enlarged in FIG. 1 for purposes of clarification. Two gap heights $h_1$ and $h_2$, which are diametrically opposed in the example of embodiment, can be different from each other. The two gap heights $h_1$ and $h_2$ differ, with the result that different process chamber ceiling temperatures occur at the two locations. Since the process chamber ceiling temperature locally influences the chemical reaction within the process chamber 4, the layer quality can differ locally.

In order to compensate for these inhomogeneities, in principle provision is also made to drive the susceptor 2 in rotation about the central axis Z by means that are not shown, but are otherwise of known art.

Measuring channels 10 are arranged in the heat dissipation body 6 at a plurality of angular positions. In the example of embodiment shown in FIG. 2, two measuring channels are arranged at diametrically opposite positions. In the example embodiment shown in FIG. 3, a total of four measuring channels 10 are provided, which in each case possess an angular separation a of 90 degrees. In example embodiments that are not shown, other configurations, for example with a six-fold symmetry of the measuring channels, can also be provided. Other example embodiments of the invention possess measuring channels 10 that are not uniformly distributed about the central axis Z.

In the example embodiments shown in FIGS. 2 and 3, the measuring zones 8, 8', 8", 8''' are located radially outboard of a substrate 13. However, in an example embodiment that is not shown, the measuring zones 8 can also be located between two substrates 13, or above the substrates.

A temperature measuring device 9, 9', 9", 9''' is assigned to each measuring channel 10, wherein these devices preferably take the form of pyrometers. The beam path 11 of the pyrometer 9, 9', 9", 9''' runs through the measuring channel 10. The surface temperature of the broad surface of the process chamber ceiling 1 facing away from the process chamber 4 is measured at temperature measuring zones 8. All temperature measuring zones 8, 8', 8", 8''' have the same radial distance R from the central axis Z. If, for example, in the configuration illustrated in FIG. 1, a lower temperature is measured with the pyrometer 9 than with the pyrometer 9', this indicates that the gap height $h_1$ is smaller than the gap height $h_2$. By means of a mounting 12, with which a positional adjustment can be made, a tilted position of the process chamber ceiling 1 can be corrected.

However, it is also possible for the different process chamber ceiling temperatures to be tolerated, since the effects that they cause can be compensated for by a rotation of the susceptor 2. In this case, an average process chamber temperature can be determined very accurately with the configuration as shown in FIG. 2. The surfaces 6', 1' do not run parallel to each other, but are planes in each case. For reasons of symmetry, two of the above-cited temperature measuring zones 8, 8', 8", 8''' are sufficient to determine an average temperature, wherein the axis of inclination, about which the process chamber ceiling 1 is inclined with respect to the heat dissipation body 6, can run at any x-angle position to the connecting line between the two temperature measuring zones 8, 8', 8", 8'''.

An average temperature obtained from the readings of the two pyrometers 9, 9' can be used to regulate the mixing ratio of a purge gas consisting of two gases.

With the arrangement shown in FIG. 3, deviations from the planarity of the process chamber ceiling can be determined.

In the example embodiment shown in FIG. 4, the zones 8, 8', 8", 8''' are at the same radial distance R from the central axis Z as that at which the substrates 13 are also located.

FIG. 4 shows a further development with regard to the purge gas supply line. Four purge gas supply lines 19, 19', 19", 19''' are provided, which are arranged in a uniform circumferential distribution about the central axis Z. The purge gas supply lines 19, 19', 19", 19''' are distanced from the central axis Z, and lie approximately in the radial center of the gap space 5. An individual mixture of a purge gas from two base gases can be fed through each purge gas supply line 19, 19', 19", 19''', wherein the two base gases differ in their thermal conductivity. The above-cited gases can be used. The mixing ratio of the two base gases is adjusted, depending on the temperatures measured in zones 8, 8', 8" 8''', in order to bring the temperature of the process chamber ceiling 1 to as constant a value as possible.

The foregoing statements serve to explain the inventions covered by the application as a whole, which in each case also independently advance the prior art, at least by means of the following combinations of features, wherein two, a plurality, or all of the said combinations of features can also be combined, namely:

A method, which is characterized in that a temperature of the process chamber ceiling 1 is measured by means of at least two sensors, in each case at different azimuthal angular positions about a central axis Z of the process chamber 4, and at the same radial distance R from the central axis Z of the process chamber 4.

A method, which is characterized in that the temperatures are the surface temperatures of zones 8 of the broad surface 1' facing towards the heat dissipation body 6, in particular adjacent to the edge 7 of the process chamber ceiling 1, distanced from the edge 7, in particular arranged in the region of the radial distance of a substrate 13, which in particular are measured in each case with a pyrometer 9, 9'.

A method, which is characterized in that the azimuthal angular positions are uniformly distributed about the central axis Z.

A method, which is characterized in that an average value, and/or at least one difference value, is formed from the measured temperatures.

A method, which is characterized in that the average value is used to select a composition of a purge gas consisting of at least two gases having different thermal conductivity properties in the gap space 5, wherein one or a plurality of purge gas supply lines 19, 19', 19", 19''' are provided, wherein in particular a plurality of purge gas supply lines 19, 19', 19", 19''' are arranged in different angular positions relative to the central axis Z, preferably in a uniform circumferential distribution, and mixtures of the two gases, which differ from one another, are fed in through the purge gas supply lines 19, 19', 19", 19''', wherein the mixing ratio is adjusted using the measured temperatures. The purge gas supply lines 19, 19', 19", 19''' are here arranged in a regular circumferential distribution, so that the thermal conductivities through the gap space 5 can be individually adjusted in a plurality of segments.

A method, which is characterized in that a difference value exceeding a predefined threshold value is used for local correction of the gap height $h_1$, $h_2$ of the gap space 5, defined by the distance of the heat conducting body 6 from the process chamber ceiling 1, or as a reason for a replacement of the process chamber ceiling 1.

A method, which is characterized in that the broad surface 1' of the process chamber ceiling 1 facing towards the heat dissipation body 6, and the surface 6' of the heat dissipation body 6 facing towards the process chamber ceiling 1, are essentially planes, and just two temperature measuring devices 9, 9' are used, which are arranged, angularly offset by an angle α of 180 degrees, about the central axis Z.

A device, which is characterized by at least two temperature measuring devices 9, 9', in particular pyrometers, which are arranged at different azimuthal angular positions about a central axis Z of the process chamber 4, at the same radial distance R from the central axis Z, in order to measure a temperature of the process chamber ceiling 1 in each case.

A device, which is characterized in that a plurality of purge gas supply lines 19, 19', 19", 19''' are provided, which are arranged in a preferably uniform angular distribution about the central axis Z, wherein through each of the purge gas supply lines 19, 19', 19", 19''' a purge gas mixture, dependent on the measured temperature, is fed into the gap space 5.

A device, which is characterized in that the broad surface 1' of the process chamber ceiling 1 facing towards the heat dissipation body 6, and the surface 6' of the heat dissipation body 6 facing towards the process chamber ceiling 1, are essentially planes, and just two temperature measuring devices 9, 9' are used, which are arranged, angularly offset by an angle α of 180 degrees, about the central axis Z.

All disclosed features are essential to the invention (both individually, and also in combination with each other). The disclosure of the application hereby also includes the full disclosure content of the associated/attached priority documents (a copy of the previous application), also for the purpose of including features of these documents in the claims of the present application. The subsidiary claims, even without the features of a claim to which reference is made, characterize with their features independent inventive further developments of the prior art, in particular in order to file divisional applications on the basis of these claims. The invention specified in each claim can additionally have one or a plurality of the features specified in the above description, in particular those provided with reference symbols, and/or in the list of reference symbols. The invention also relates to forms of design in which individual features cited in the above description are not implemented, in particular to the extent that they are recognizably dispensable for the respective intended use, or can be replaced by other means having the same technical effect.

LIST OF REFERENCE SYMBOLS

1 Process chamber ceiling
1' Broad surface
2 Susceptor
3 Heating device
4 Process chamber
5 Gap space
6 Heat dissipation body
6' Surface, lower face
7 Edge
8 Zone
8' Zone
8" Zone
8''' Zone
9 Pyrometer, temperature measuring device
9' Pyrometer, temperature measuring device
9" Pyrometer, temperature measuring device
9''' Pyrometer, temperature measuring device
10 Measuring channel
11 Optical beam path
12 Mounting
13 Substrate
14 Gas inlet
15 Gas inlet element
16 Gas outlet
17 Housing
18 Temperature control means
19 Purge gas supply line
19' Purge gas supply line
19" Purge gas supply line
19''' Purge gas supply line
$h_1$ Height
$h_2$ Height
R Distance
Z Central axis
α Angle

What is claimed is:

1. A method for setting up or operating a chemical vapor deposition (CVD) reactor, with which one or more layers are deposited on one or more substrates (13), wherein a susceptor (2) is heated by means of a heating device (3), heat is transported from the susceptor (2), through a process chamber (4) having a central axis (Z), to a process chamber ceiling (1), through the process chamber ceiling (1), and from the process chamber ceiling (1), through a gap space (5), to a heat dissipation body (6), the method comprising:
  measuring, with temperature measuring devices (9, 9'), respective temperatures of the process chamber ceiling (1) at two or more measuring points on a surface of the process chamber ceiling (1), wherein respective azimuthal angular positions of the two or more measuring points with respect to the central axis (Z) of the process chamber (4) are different from one another, and respective radial distances (R) of the two or more measuring points from the central axis (Z) of the process chamber (4) are identical to one another.

2. The method of claim 1, wherein the two or more measuring points include a first measuring point, on the surface of the process chamber ceiling (1), at which a first temperature of the surface of the process chamber ceiling is measured, and a second measuring point, on the surface of the process chamber ceiling (1), at which a second temperature of the surface of the process chamber ceiling (1) is measured, wherein the first and second measuring points are located adjacent to an edge (7) of the process chamber ceiling (1), or are located away from the edge (7).

3. The method of claim 2, wherein the first and second measuring points are assigned to respective zones (8, 8', 8", 8') on a broad surface (1') of the process chamber ceiling (1) facing towards the heat dissipation body (6).

4. The method of claim 3, wherein the zones (8, 8', 8", 8''') are arranged in a first annular region of the surface of the process chamber ceiling, wherein the one or more substrates (13) are arranged in a second annular region of the susceptor (2), and wherein the first annular region is arranged directly above the second annular region.

5. The method of claim 1, wherein the temperature measuring devices (9, 9') include a pyrometer (9, 9').

6. The method of claim 1, wherein the two or more measuring points are uniformly distributed about the central axis (Z) of the process chamber (4).

7. The method of claim 1, further comprising determining one or more of an average value, or a difference value formed from the measured temperatures.

8. The method of claim 7, further comprising:
based on the average value, selecting a composition of a purge gas that includes at least two gases having thermal conductivity properties that are different from one another; and
flowing the purge gas through one or more purge gas supply lines (19, 19', 19", 19''') and into the gap space (5).

9. The method of claim 7, wherein in response to the difference value exceeding a predefined threshold value:
(i) adjusting a height ($h_1$, $h_2$) of the gap space (5) defined by a distance of the heat dissipation body (6) from the process chamber ceiling (1), or
(ii) replacing the process chamber ceiling (1) with a new process chamber ceiling (1).

10. The method of claim 1, wherein a broad surface (1') of the process chamber ceiling (1) facing towards the heat dissipation body (6), and a surface (6') of the heat dissipation body (6) facing towards the process chamber ceiling (1), are planar surfaces, and the temperature measuring devices (9, 9') consist of a first and second temperature measuring device (9, 9') that are arranged along a line that intersects the central axis (Z).

11. The method of claim 1, further comprising:
based on the measured temperatures, adjusting a mixing ratio of two gases that form a purge gas, the two gases having thermal conductivity properties that are different from one another; and
flowing the purge gas through purge gas supply lines (19, 19', 19", 19''') and into the gap space (5), wherein the purge gas supply lines (19, 19', 19", 19''') are distributed at different angular positions about the central axis (Z).

12. A device, comprising:
heating device (3);
a susceptor (2) that is heated by means of the heating device (3);
a process chamber (4) having a central axis (Z), wherein the process chamber is bounded by the susceptor (2) and a process chamber ceiling (1) running parallel to the susceptor (2);
a heat dissipation body (6) that is spatially separated from the process chamber ceiling (1) by a gap space (5), wherein the gap space (5) is purged by a purge gas, wherein the heat dissipation body (6) has temperature control means (18) in order to dissipate heat generated by the heating device (3), which heat is transported through the susceptor (2), the process chamber ceiling (1), and the gap space (5), to the heat dissipation body (6); and
two or more temperature measuring devices (9, 9') for measuring respective temperatures on a surface of the process chamber ceiling (1) at two or more measuring points, wherein respective azimuthal angular positions of the two or more measuring points about the central axis (Z) of the process chamber (4) are different from one another, and respective radial distances (R) of the two or more measuring points from the central axis (Z) are identical to one another.

13. The device of claim 12, further comprising a plurality of purge gas supply lines (19, 19', 19", 19'''), wherein a purge gas mixture dependent on the measured temperatures is fed through each of the purge gas supply lines (19, 19', 19", 19''') into the gap space (5).

14. The device of claim 13, wherein the purge gas lines (19, 19', 19", 19''') are arranged in a uniform angular distribution about the central axis (Z).

15. The device of claim 12, wherein a broad surface (1') of the process chamber ceiling (1) facing towards the heat dissipation body (6), and a surface (6') of the heat dissipation body (6) facing towards the process chamber ceiling (1), are planar surfaces, and the two or more temperature measuring devices (9, 9') consist of a first and a second temperature measuring device (9, 9') that are arranged along a line that intersects the central axis (Z).

16. The device of claim 12, wherein the two or more temperature measuring devices (9, 9') comprise a pyrometer (9, 9').

* * * * *